US012593617B2

(12) United States Patent
Novozhilov et al.

(10) Patent No.: US 12,593,617 B2
(45) **Date of Patent: *Mar. 31, 2026**

(54) SUPERCONDUCTOR FLUX PINNING WITHOUT COLUMNAR DEFECTS

(71) Applicant: MetOx International, Inc., Houston, TX (US)

(72) Inventors: Mikhail Novozhilov, Houston, TX (US); Alex Ignatiev, Houston, TX (US)

(73) Assignee: MetOx International, Inc., Houston, TX (US)

( * ) Notice: Subject to any disclaimer, the term of this patent is extended or adjusted under 35 U.S.C. 154(b) by 8 days.

This patent is subject to a terminal disclaimer.

(21) Appl. No.: 18/817,333

(22) Filed: Aug. 28, 2024

(65) Prior Publication Data

US 2025/0380618 A1 Dec. 11, 2025

Related U.S. Application Data

(63) Continuation of application No. 17/282,933, filed as application No. PCT/US2019/055745 on Oct. 10, 2019, now Pat. No. 12,120,964.

(Continued)

(51) Int. Cl.
*H10N 60/01* (2023.01)
*C23C 16/02* (2006.01)

(Continued)

(52) U.S. Cl.
CPC ..... *H10N 60/0828* (2023.02); *C23C 16/0272* (2013.01); *C23C 16/404* (2013.01);

(Continued)

(58) Field of Classification Search
CPC . C23C 16/0272; C23C 16/404; C23C 16/405; C23C 16/408; C23C 16/482;

(Continued)

(56) References Cited

U.S. PATENT DOCUMENTS 3,483,313 A * 12/1969 Schaffhauser ........... H01B 7/12 174/101.5
2004/0247779 A1* 12/2004 Selvamanickam ... C23C 16/511 505/430

(Continued)

FOREIGN PATENT DOCUMENTS

JP 2015198057 A 11/2015

OTHER PUBLICATIONS

Supplementary European Examination Report issued in relation to pending European Patent Application EP19891865.8, Dec. 17, 2024.

(Continued)

*Primary Examiner* — Timothy J Thompson
*Assistant Examiner* — Rhadames Alonzo Miller

(57) ABSTRACT

There is a superconducting article that includes a superconducting film comprising a substrate, one or more buffer layers, and a high temperature superconducting (HTS) layer. The superconducting layer may be comprised of the chemical composition $REBa_2Cu_3O_{7-x}$, where RE is one or more rare earth elements, for example: Y, La, Nd, Sm, Eu, Gd, Tb, Dy, Ho, Er, Tm, Yb and Lu. The superconductor layer is produced using Photo-Assisted Metal Organic Chemical Vapor Deposition (PAMOCVD) and contains non-superconducting nanoparticles. The nanoparticles are substantially provided in the a-b plane and naturally oriented. The non-superconducting nanoparticles provide flux pinning centers that improve the critical current properties of the superconducting film.

20 Claims, 8 Drawing Sheets

Related U.S. Application Data

(60) Provisional application No. 62/745,373, filed on Oct. 14, 2018, provisional application No. 62/745,372, filed on Oct. 14, 2018.

(51) Int. Cl.

| | |
|---|---|
| ***C23C 16/40*** | (2006.01) |
| ***C23C 16/48*** | (2006.01) |
| ***H10N 60/20*** | (2023.01) |

(52) U.S. Cl.
CPC .......... *C23C 16/405* (2013.01); *C23C 16/408* (2013.01); *C23C 16/482* (2013.01); *H10N 60/0464* (2023.02); *H10N 60/0632* (2023.02); *H10N 60/203* (2023.02)

(58) Field of Classification Search
CPC ........... H10N 60/0464; H10N 60/0632; H10N 60/0828; H10N 60/203
See application file for complete search history.

(56) References Cited

U.S. PATENT DOCUMENTS

| | | | | |
|---|---|---|---|---|
| 2005/0159298 | A1* | 7/2005 | Rupich | H10N 60/0828 502/100 |
| 2008/0176749 | A1* | 7/2008 | Goyal | H10N 60/857 977/773 |
| 2009/0178825 | A1* | 7/2009 | Wu | H01B 7/425 174/113 R |
| 2011/0028328 | A1* | 2/2011 | Selvamanickam | C23C 28/322 428/323 |
| 2012/0015814 | A1* | 1/2012 | Usoskin | H10N 60/857 977/773 |
| 2014/0113828 | A1* | 4/2014 | Gilbert | G01K 7/006 252/500 |
| 2014/0261604 | A1* | 9/2014 | Jha | H10N 10/857 136/200 |
| 2016/0172080 | A1* | 6/2016 | Selvamanickam | H10N 60/203 252/512 |
| 2017/0338006 | A1* | 11/2017 | Gontarz | B60L 3/00 |
| 2018/0287037 | A1* | 10/2018 | Maekawa | H10N 10/855 |
| 2019/0164665 | A1* | 5/2019 | Sato | H01B 7/421 |

OTHER PUBLICATIONS

English translation of JP2015198057 (listed above under "Foreign Patents"), Nagoya University, Published Nov. 9, 2015. [EPO Citation D5.].

Majkic et al., "High Performance 2G-HTS Wire Using a Novel MOCVD System", IEEE Transactions on Applied Superconductors, vol. 25, No. 3, Jun. 2015. [EPO Citation D8.].

Aytug et al., "Nano-engineered defect structures in Ce- and Ho-doped metal-organic chemical vapor deposited YBa2Cu3O6+ films: Correlation of structure and chemistry with flux pinning performance", Jrnl of Appl Physics, 109, 113923, 2011. EPO Citation D9].

* cited by examiner

400

SUPERCONDUCTOR FLUX PINNING WITHOUT COLUMNAR DEFECTS

CROSS REFERENCE TO RELATED APPLICATIONS

This application is a continuation of U.S. patent application Ser. No. 17/282,933 filed Apr. 5, 2021, which is a national stage application of PCTUS19/55745 filed Oct. 19, 2021, which claims priority and benefit from U.S. Provisional Patent Application No. 62/745,373, filed on Oct. 14, 2018, and U.S. Provisional Patent Application No. 62/745,372, filed on Oct. 14, 2018. The entire content of each application listed above is hereby incorporated in their entirety herein by reference.

BACKGROUND OF THE INVENTION

Technical Field

Embodiments of the subject matter disclosed herein generally relate to compositions and structures for fabricated high-temperature superconductors with incorporated non-superconducting material to provide high flux pinning centers and methods of production of same.

Discussion of the Background

Since the original discovery of superconductivity in 1911, many superconductor materials have been discovered. In 1986 the first material having superconducting properties at liquid nitrogen temperature (77K) was determined. This material, $YBa_2Cu_3O_{7-x}$ (YBCO), is one of a group of oxide-based superconductors called high temperature superconductors (HTS). High temperature superconductors provide the potential for development of superconductor components at higher operating temperatures compared to traditional superconductors that operate at liquid helium temperature (4.2K). Superconductors operating at the higher temperatures provide the ability to develop superconducting components and products more economically. After the initial discovery of YBCO superconductors, other superconductors were discovered having a similar chemical composition but with Y replaced by other rare earth elements. This family of superconductors is often denoted as REBCO where RE may include Y, La, Nd, Sm, Eu, Gd, Tb, Dy, Ho, Er, Tm, Yb or Lu.

The first commercial HTS wires did not use the REBCO material for its superconductor medium. The "first generation HTS" wires, that used a material having the $Bi_2Sr_2CaCu_2O_{8+y}$ or $Bi_2Sr_2Ca_2Cu_3O_{10+y}$ chemical composition, required the significant use of an expensive noble metal, namely silver (Ag) as a containment as well as stabilizing medium. The "second generation HTS (2G)" wire was thus made using the REBCO as the superconducting material. This wire referred to as a coated conductor uses a textured metal substrate onto which is deposited a textured REBCO thin film providing a more cost-effective way to manufacture HTS wire having acceptable critical currents at the desired temperatures and magnetic fields for the applications.

There are several methods for deposition of the thin film REBCO in the manufacturing of REBCO wire including metal organic chemical vapor deposition (MOCVD), pulsed laser deposition (PLD), reactive co-evaporation (RCE), and metal organic deposition (MOD). Many methods within the category of physical vapor deposition (PVD) techniques suffer from generally low growth rates, a requirement for high vacuum, continual source change-out, moderate area coverage and a restriction to only line-of-sight deposition. Such limitations, especially the low growth rates, are problematic for the commercialization of the YBCO film technology for HTS wires and tapes. MOCVD can overcome many of these drawbacks and produce high superconducting quality thin and thick YBCO films for coated conductor applications.

MOCVD, first developed in the early 1970's is now a major thin film fabrication technique in the semiconductor-based microelectronics industry. Given the industrial history for MOCVD, this technology has been directly transferred to YBCO film growth and has shown the capability for fabrication of high quality YBCO samples. Initial work on the application of MOCVD to YBCO thin film growth was begun in the early period of high temperature superconductivity research. Although the initial efforts yielded marginal material, several groups began the growth of YBCO films through the application of the by then standard microelectronics developed MOCVD technique modified for higher temperatures, oxidizing atmospheres and lower vapor pressure precursors (Zhang et. al.).

The higher temperatures (more than 200K higher than for semiconductor III-V compounds) required improved reactor designs and improved heaters, and the lower vapor pressure precursors required enhanced attention to precursor vapor flow control and stability. The initial results were promising, and for films grown on single crystal oxide substrates $Tc>90K$ and $Jc>10^6$ A/cm$^2$ were realized (Schulte et al.).

Since the organometallic precursors are sensitive to photo-dissociation, photo-irradiation was also applied to MOCVD. Initial work focused on excimer laser irradiation of the reaction in attempts to increase the dissociation rate of the precursors (Higashiyama et al.). This yielded only moderate improvement in superconducting properties, but with some improvement in surface smoothness and in the generation of a-axis surface alignment of the YBCO growth.

The basic architecture of all wires is generally based upon similar thin film structures. The superconducting layer in all these wires is typically biaxially textured with the a and b crystallographic axis of REBCO aligned co-planer to the surface of the film and the c-axis normal to the surface to the film as shown in FIG. 1. Due to the anisotropic nature of the superconductor thin film architecture, as well as the inherent anisotropy of the superconducting properties in the REBCO materials, the Ic in these wires commonly display anisotropic properties.

With the discovery of high temperature superconductor (HTS) materials, one of the foci was directed towards the development of HTS wire for high power electrical applications. Such applications include, but are not limited to, transmission cables, distribution cables, electric motors, electric generators, electric magnets, fault current limiters, transformers, and energy storage. For the HTS wire to be a successful solution for these high-power electrical applications, it needs to meet the high-power electrical requirements of the different applications while being low enough in cost to meet the commercial requirements for these applications. One of the primary electrical characteristics of interest is the critical current of the HTS wire. The critical current (Ic) is the electrical current at which the superconductor loses its superconductor properties and becomes non-superconducting. The critical current of the superconductor is affected by the temperatures and magnetic fields experienced by the superconductor. The higher the temperature and magnetic field, the lower the critical current. To be able to meet the technical requirements for the variety of applications, the HTS wires will need to have high enough critical currents in the temperatures and magnetic fields experienced by these applications.

One of the key approaches for increasing the critical current carrying capacity of the superconductor is through the introduction of magnetic flux pinning material into the superconductor. At higher magnetic fields, type II superconductors allow magnetic flux to enter in quantized packets surrounded by a superconducting current vortex. These sites of penetration are known as flux tubes. Flux pinning is the phenomenon where free motion of magnetic flux tubes in type II superconductors is inhibited due to their interaction with defects in the superconducting material. A flux tube which is adjacent or encompassing such a defect has its energy altered and its motion through superconducting material is impeded. Flux pinning seeks to take advantage of the dual critical fields that allow penetration of magnetic field lines into type II superconductors and which limit performance characteristics. Increased anisotropy and reduced current carrying capacity results from unpinned flux tubes which aid the permeation of magnetic flux. Flux pinning is thus desirable in high-temperature superconductors to prevent "flux creep", which induces voltage and effective resistance of the conductor and diminishes critical current Ic and critical current density Jc.

Thus, the inclusion of pinning sites or centers that act as magnetic flux pinning centers within the superconductor aid in the improvement of critical current carrying capacity. The pinning centers are currently composed of specific compositions of non-superconducting material with specific orientations. Such centers may generally be referred to as pinning sites or centers, flux pinning centers, defects, or defect centers. The presence of these flux pinning centers provides the wire the ability to improve critical currents, even in high magnetic fields.

As with any superconducting wire, one of the key objectives has been to improve the flux pinning properties and in turn, improve the Ic of the REBCO wires. Many processes have been investigated to produce a REBCO superconductor film with nanoparticle inclusions as pinning centers to further improve current capacity. The REBCO fabrication process has been varied to naturally create non-superconducting impurities such as $Y_2O_3$ and $Y_2BaCuO_5$ in specific orientations relative to the superconducting layer to yield improvements in flux pinning and corresponding Ic.

Other materials that are not part of the REBCO group of elements are known to be introduced into the superconductor layer to create the non-superconducting particles. Materials such as $BaMO_3$ where M may be Ti, Zr, Al, Hf, Ir, Sn, Nb, Mo, Ta, Ce, V are added as doping material to create the non-superconducting nanoparticles.

Current methods to achieve flux pinning capability commonly introduce secondary phase particles as the pinning material. For example, U.S. Pat. No. 7,737,087 describes the addition of a Group 4 or Group 5 metal having a close lattice match to the HTS material which leads to introduction of strain into the thin film thereby generating dislocations that yield flux pinning within the REBCO thin film.

Other methods as described for example in U.S. Pat. No. 8,926,868 rely upon fabrication of specific nanostructure within the HTS layer from high energy bombardment to form randomly distributed nanoholes which are then used to form nanorods. Also, U.S. Pat. No. 8,119,571 provides for self-assembled nanodots and nanorods in the form of preferentially c-axis oriented columns of nanodots and/or nanorods as shown in FIG. 2.

This doping of foreign material combined with the columnar distribution of preferentially c-axis orientated nanoparticles has yielded REBCO wire with improved performance and increased Ic, especially in high magnetic fields, as compared to non-doped material. However, the production methods to produce these nanodots and nanorods is highly complex in order to deposit the doped material in specific super structures (e.g. columns) and orientations relative to the superconductor layer. Difficulties in achieving correct preferential orientation of the doping material restricts the growth rate of the wire which adds production time, and concomitant cost and complexity. Thus, it is of great value to develop a superconducting article and fabrication process that does not require doping with foreign material, nor specific oriented growth of nanoparticles; while producing high performance HTS wire that meets the Ic requirements of high-power applications, even at high magnetic fields. It is a further objective to produce a superconductor capable of meeting those requirements at a high growth rate to enable production with commercially attractive economics.

SUMMARY OF EXAMPLE EMBODIMENTS

According to an embodiment, there is a thin film composite high-temperature superconductor. The superconductor includes a substrate; a buffer layer; and a high-temperature superconducting layer with a non-superconducting material. The non-superconducting material is distributed along the a-b plane of the superconducting layer.

According to another embodiment, there is a method for forming a high-temperature superconductor, the method including providing a substrate; depositing a buffer layer upon the substrate; depositing a high-temperature superconductor layer upon the buffer layer; and co-depositing a non-superconducting material layer where the non-superconducting material is randomly distributed within the superconducting layer and lacks a substantial vertically oriented component.

According to yet another embodiment there is a thin film composite high-temperature superconducting article. The superconducting article includes a substrate; a buffer layer; a high-temperature superconducting layer with non-superconducting material distributed preferentially along the a-b plane coplanar with the superconducting layer; and a lift factor at 4K, 20T of 2 or greater.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION OF EXAMPLES OF THE INVENTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to a high-temperature superconductor with $Y_2O_3$ non-superconducting centers deposited using the fabrication technique of photo-assisted MOCVD. However, the embodiments discussed herein are not limited to such elements.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1:
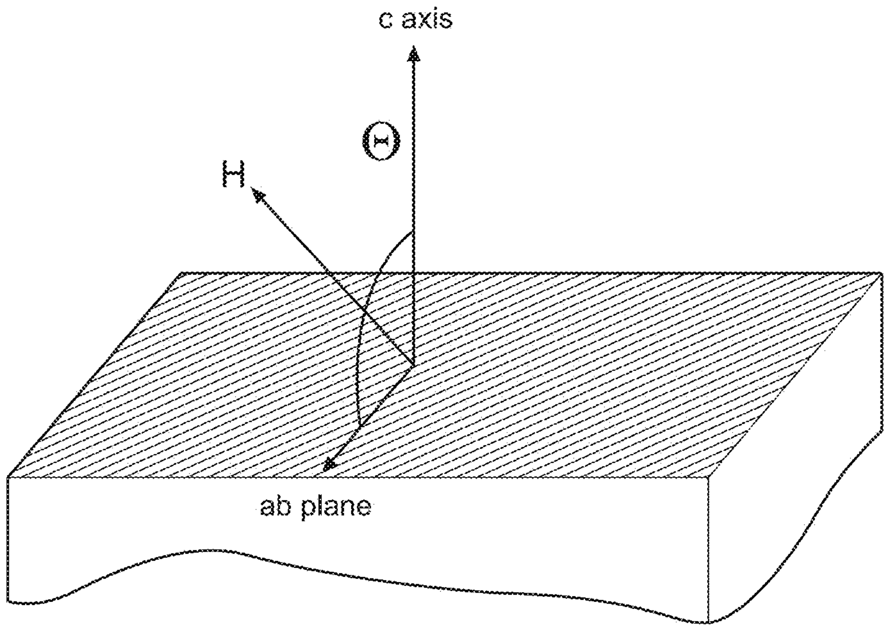
FIG. 1 shows the axes and planes of reference relative to a high temperature superconducting film.
Figure 2:
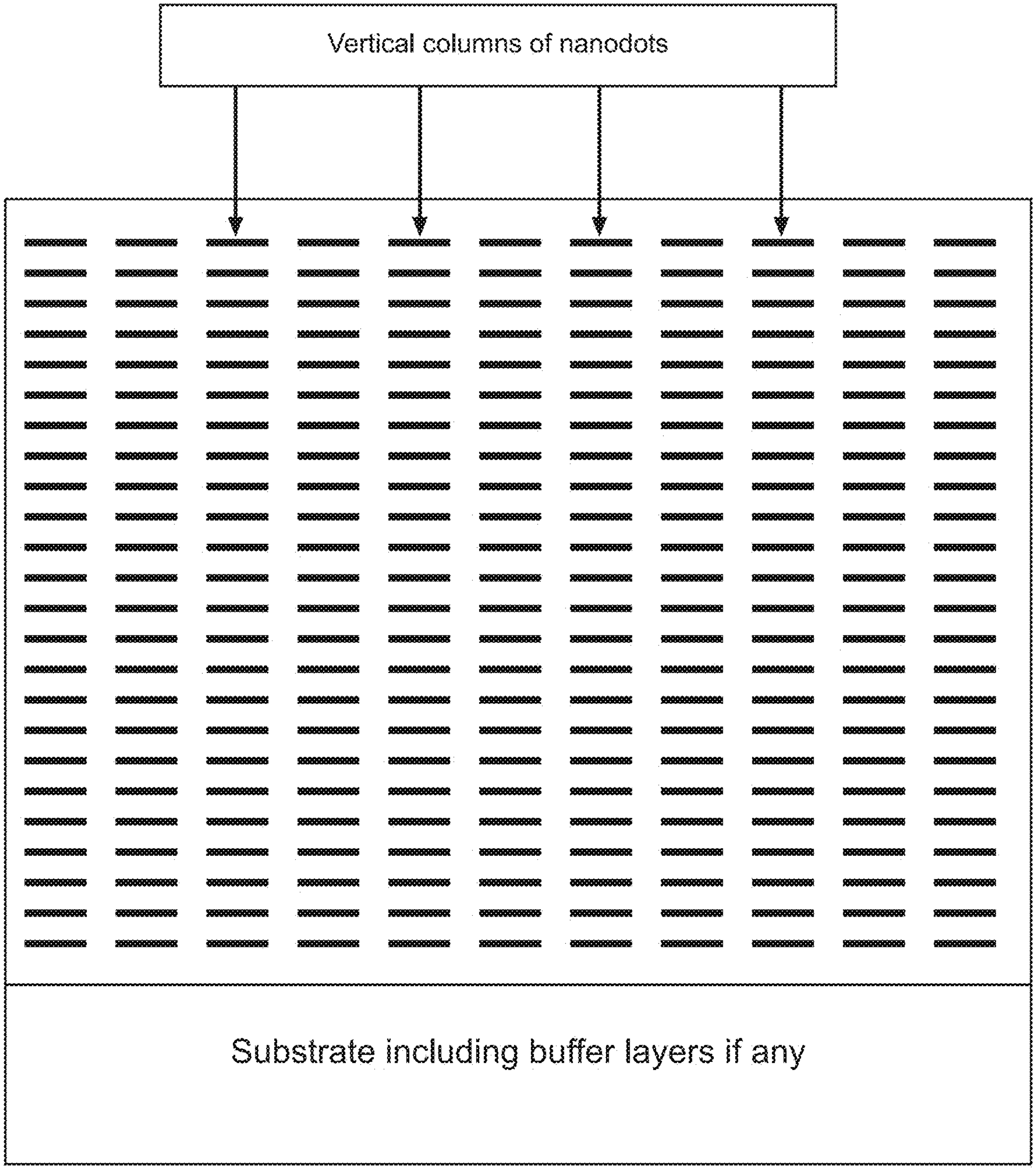
FIG. 2 shows a prior art superconductor with vertical columns of defects.

Embodiments of REBCO HTS superconductor tapes and wires of the present invention may include nano-sized particles distributed within the a-b plane of the superconducting layer of the wire to provide high Ic at high magnetic fields. In this context, said particles within the a-b plane shall mean within the plane that is coplanar to the superconducting layer (see FIG. 1). Within the a-b plane may include particles fully encompassed by the superconductor layer or particles extending above, below or upon an upper or lower boundary defined by the superconductor layer's upper and lower thin film boundaries, or at multiple positions with the a-b plane.

Preferred embodiments of methods for manufacturing high Ic wire according to the present disclosure do not require a c-axis oriented HTS layer, or preferentially vertically aligned columns of nanodots or nanorods, nor does it require preferentially vertically aligned second phases, dopants or stacking faults as described by the prior art.

Embodiments of the methods disclosed herein yield non-superconducting nanoparticles being substantially preferentially distributed along the a-b plane within the HTS layer with no specific vertical or near vertical alignment. The presently disclosed nanoparticles captured in the a-b plane within the HTS layer and without specific vertical (c-axis) orientation can be used to obtain high Ic, at high magnetic fields and low temperatures. The reduction in criticality of nanoparticle c-axis alignment in-turn reduces cost as the production process is not restricted due to the need to orient the crystals nor the requirement to introduce rod shaped non-superconducting dopants into the process.

Figure 3:
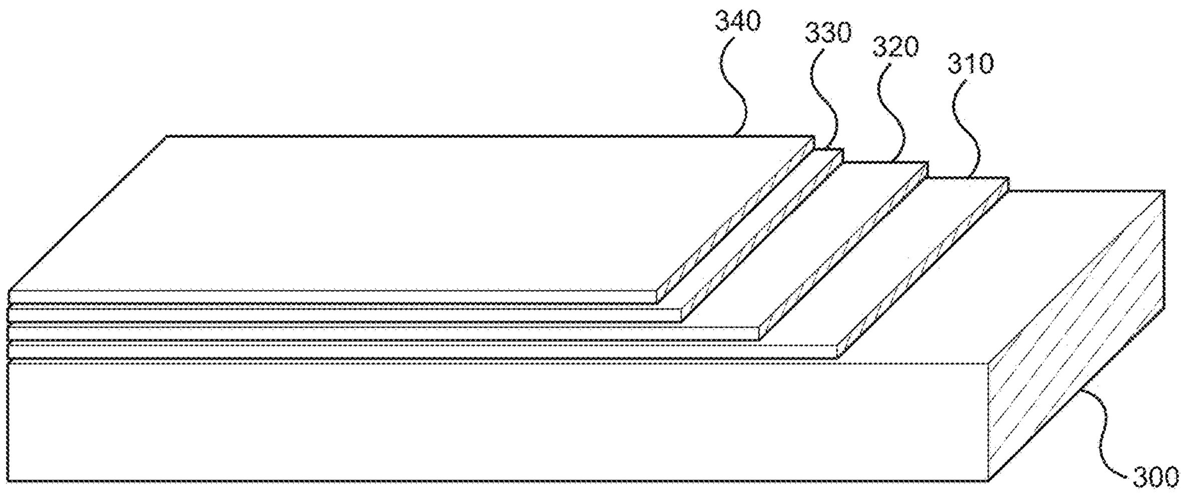
FIG. 3 shows an exemplary architecture of a high temperature superconductor.

The epitaxial REBCO high temperature superconductor (HTS) wire is processed in certain preferred embodiments by using Metal Organic Chemical Vapor Deposition (MOCVD) or other suitable deposition process known in the art of superconductor fabrication. The wire typically has a thin film composite architecture an example of which is shown in FIG. 3. In this example, the architecture includes a substrate 300, at least one buffer layer (two are shown in this example as 310 and 320), at least one superconducting layer (one is shown in this example as 330), and at least one capping or stabilizing layer 340. Other layers are readily contemplated by those skilled in the art and may provide additional purpose to the basic architecture described herein.

The architecture may have a crystal orientation where the a and b axis are oriented along the surface of the film while the c axis is oriented normal to the film surface. This crystallographic orientation of the REBCO layer is typically obtained by using an atomically textured substrate 300 comprised of a metal foil with one or more atomically textured buffer layer(s) deposited on the metal.

The substrate metal 300 is typically in the form of a flexible foil or tape and is typically comprised of a metal-based alloy including but not limited to stainless steel alloys and nickel-based metal alloys. The metal-based substrates may have a tape structure with a high relative width and length as compared to its thickness. A typical width may be 12 mm, but can be more than 100 mm, while the length may be 100's of meters long and above. This metal substrate 300 may be processed to form a biaxial texture via use of rolling assisted biaxially textured substrate ("RABiTS") process or other process known in the art to be suitable for texturing a metal substrate.

In certain preferred embodiments, the metal layer is non-textured, for example Hastelloy, Inconel or other alloy and instead of directly texturing the metal surface, the substrate metal layer 300 may have at least one or more deposited buffer layer(s) 310 and 320 atop the metal layer 300 that is/are biaxially textured. Such layers provide that the buffer's crystalline axes are aligned in plane and normal to the metal layer's surface.

Deposition based biaxial texturing of the buffer layer or layers may be achieved via Ion Beam Assisted Deposition (IBAD), Pulsed Laser Deposition (PLD), or Inclined Substrate Deposition (ISD) or other methods. The biaxially textured film may have a rock salt (halite) like crystal structure. The biaxial texturing is necessary for proper crystallographic alignment of the REBCO superconductor layer when deposited upon the substrate 300 for optimum superconducting performance. The buffer material may be specified to ensure a desired lattice mismatch between the buffer (310, 320) and the REBCO HTS layer 330 to foster development of nanoparticles to be discussed later.

The high-temperature superconducting (HTS) layer 330 is typically comprised of HTS materials known in the art capable of generating superconducting behavior at 77K or above which corresponds to the temperature of liquid nitrogen. Suitable materials may include $YBa_2Cu_3O_{7-x}$ (YBCO) or $BiSr_2CaCu_2$ among others. Other stoichiometries of YBCO are known, including but not limited to $Y_2Ba_4Cu_7O_{14+x}$, $YBa_2Cu_4O_8$ and others, which are also contemplated by the present disclosure and which are generally and henceforth will be referred to as YBCO material. In other embodiments, other rare earth elements may be substituted in place of Y, generally referred to as the family of materials $REBa_2Cu_3O_{7-x}$ (REBCO) where RE may include Y, La, Nd, Sm, Eu, Gd, Tb, Dy, Ho, Er, Tm, Yb or Lu.

For second generation (2G) high temperature superconductors (HTS), the flux pinning force is related to the density, size and dimensionality of the defects introduced. In preferred embodiments, the non-superconducting flux pinning particles are randomly dispersed within the superconducting layer. The material composition of the non-superconducting flux pinning sites can include but are not limited to $RE_2O_3$ and $BaMO_3$. For $RE_2O_3$, RE may include Y, La, Nd, Sm, Eu, Gd, Tb, Dy, Ho, Er, Tm, Yb or Lu. In the case of $BaMO_3$, $BaMO_3$ nanoparticle formation in REBCO requires the additional element of M where M includes one or more of the following elements: Ti, Zr, Al, Hf, Ir, Sn, Nb, Mo, Ta, Ce, and V.

Figure 4:
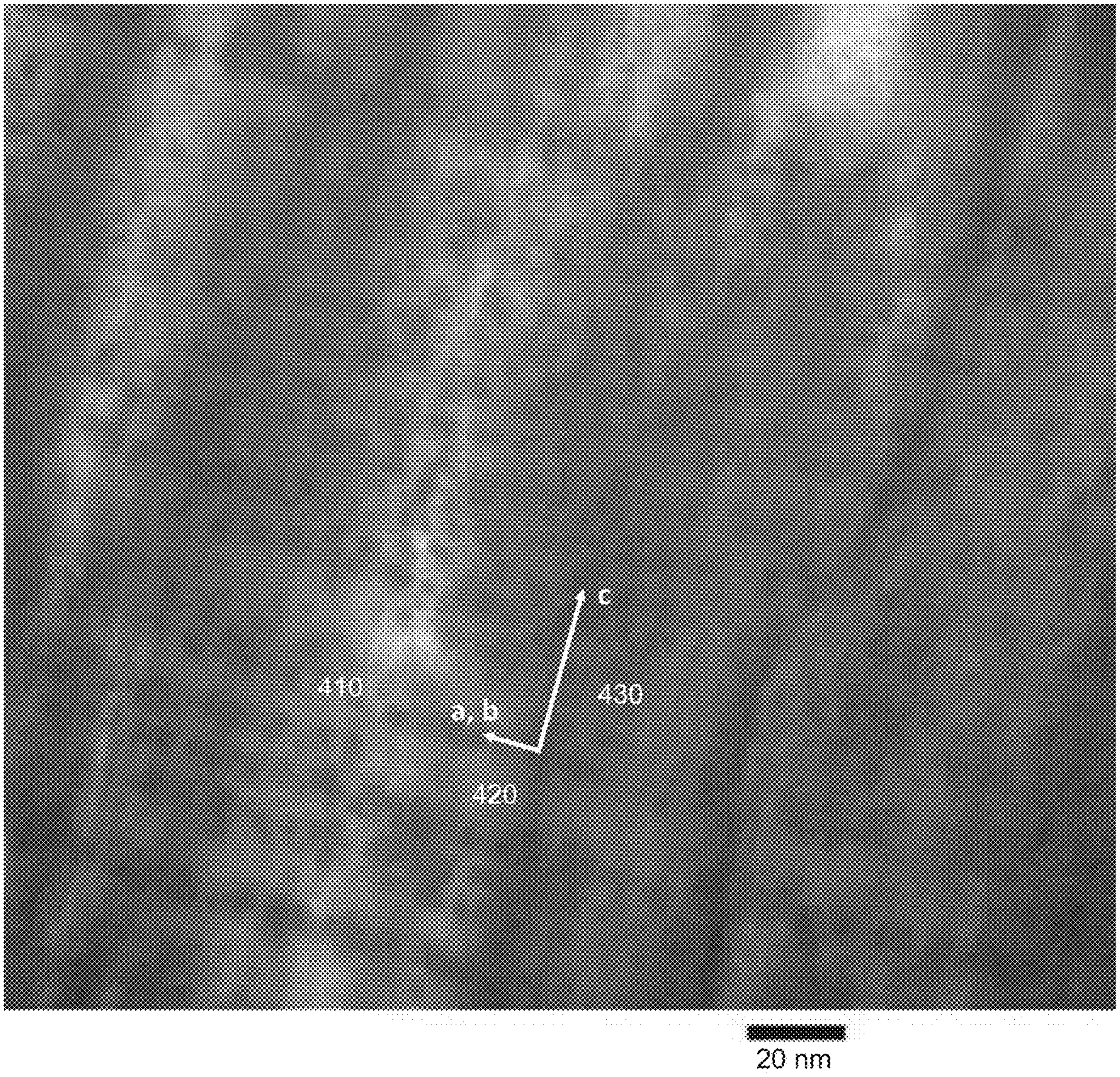
FIG. 4 shows a Transmission Electron Microscope image of an exemplary YBCO superconductor material with nanoparticles produced by methods of the present invention.

FIG. 4 shows a Transmission Electron Microscope image of an exemplary YBCO superconductor 400 material with non-superconducting nanoparticles 410 produced by methods of the present invention. The nanoparticles 410 are distributed along the crystallographic a-b plane 420 instead of the c-axis 430. In this example, note that the sample was prepared by cross-sectioning an HTS tape, thus exposing the HTS layer's depth (c-axis). Given that the layer may be in certain embodiments 10s to 1000s or more nanometers in thickness; more than one sub-plane within the a-b plane may be apparent. In this example, non-superconducting nanoparticles appear as dark striations randomly distributed within the a-b plane of the HTS superconductor. Also, in this example, with the c-axis out of the page, there is no observably substantial orientation nor distribution of non-superconducting particles along the c-axis 430 normal to the a-b plane 420.

Figure 5:
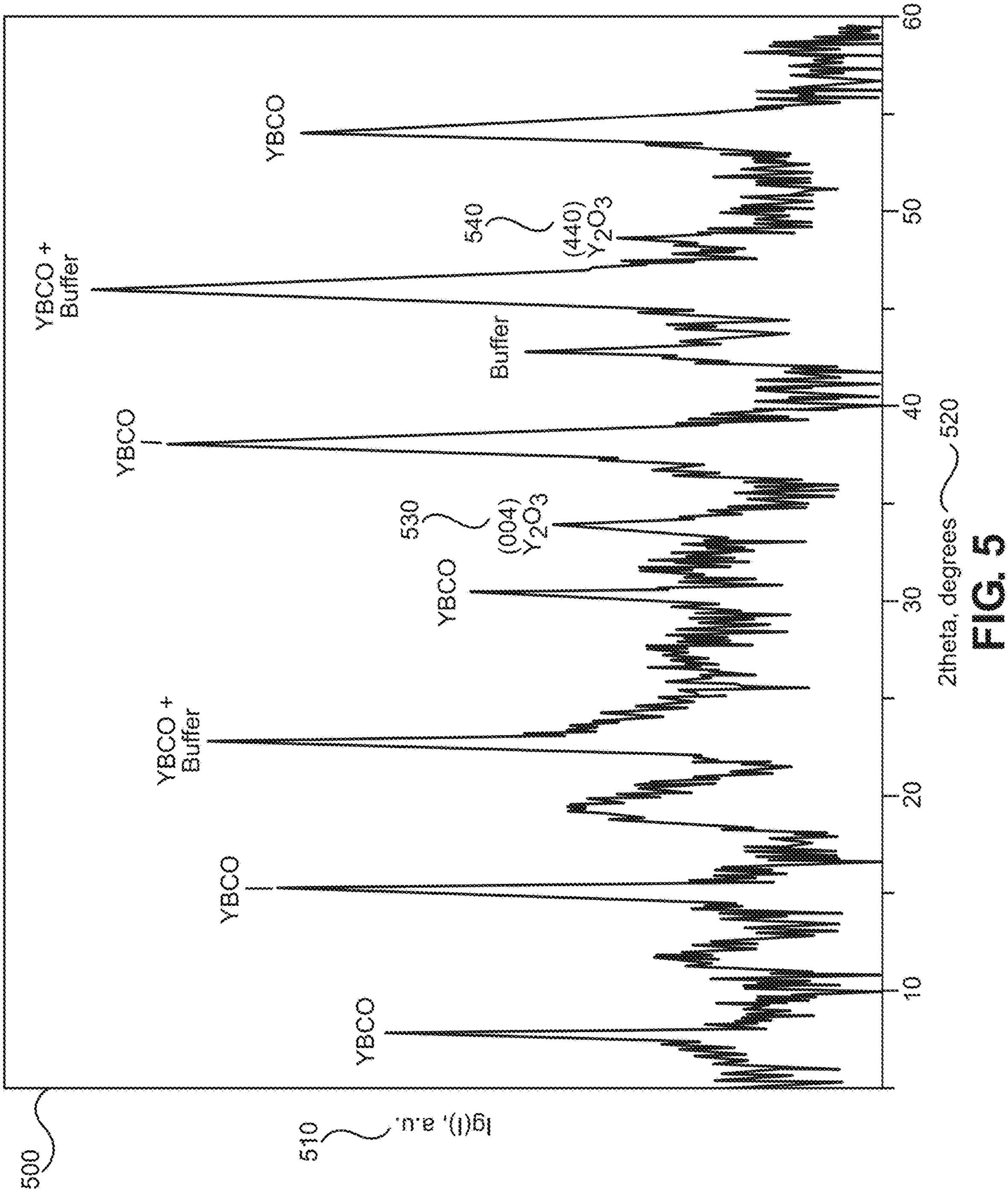
FIG. 5 shows the X-ray diffraction (XRD) pattern for an exemplary HTS YBCO material of the present invention.

FIG. 5 shows the X-ray diffraction (XRD) pattern 500 for an exemplary HTS YBCO material of the present invention that show high intensity (Y-axis 510) characteristic diffraction peaks 530 and 540 corresponding to the signature 2-theta (2θ) positions (X-axis 520) of $Y_2O_3$ in the YBCO superconductor material 330. The XRD data demonstrates that the nanoparticles found distributed along the a-b plane 420 are composed of $Y_2O_3$ non-superconducting material.

The size of the non-superconducting flux pinning particles can range up to 100 nm or larger in diameter. $RE_2O_3$ nanoparticles form within the a-b planes of the REBCO layer without the need of additional elements beyond those typically contained in the precursor vapor source for growing REBCO superconducting material. Thus, in preferred embodiments, the non-superconducting flux pinning particles are co-deposited with the superconducting material without introduction of foreign material. It is a further feature of the presently disclosed superconducting wire and fabrication methods that the particles lack a substantial c-axis orientation.

The formation of these a-b plane distributed nanoparticles can be achieved in certain preferred embodiments using a Photo-Assisted Metal Organic Chemical Vapor Deposition (PAMOCVD) process without reducing the growth rate as commonly occurs with other growth methods that yield preferentially vertically orientated nanoparticles as shown in FIG. 6.

Figure 6A:
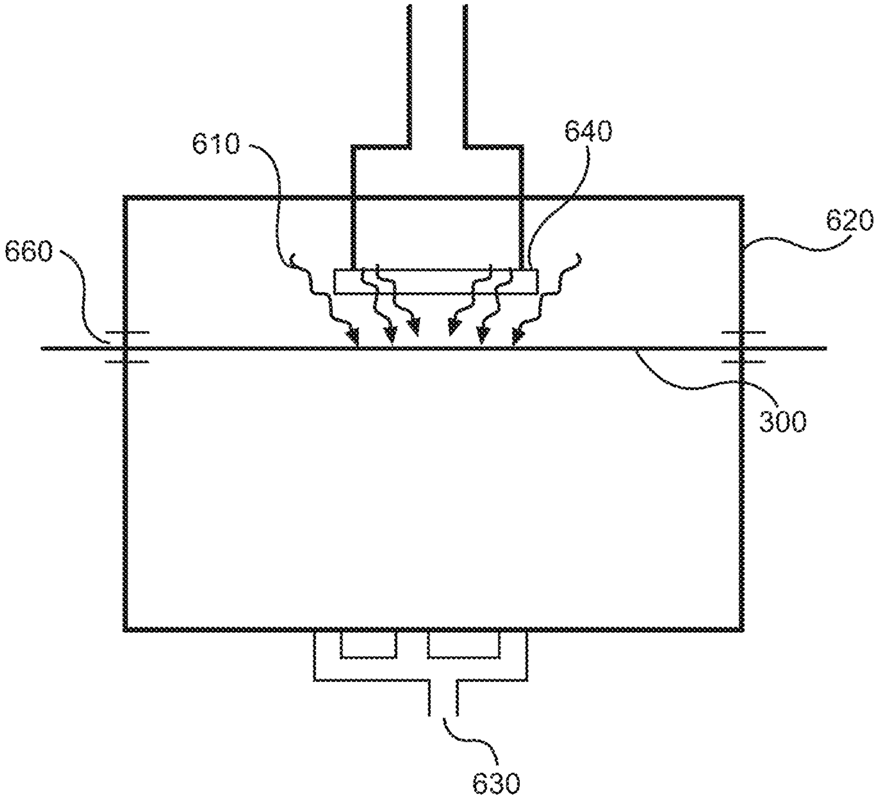
FIG. 6A-C shows different aspects of an exemplary PAMOCVD deposition system.

FIG. 6A shows an exemplary PAMOCVD system whereby the application of UV and visible light provides the energetic source to the reaction process to increase the mobility of the incoming atoms to form the non-superconducting nanoparticles during the deposition and distribution of both non-superconducting and superconducting material. The UV/visible radiation source 610 is typically enclosed within a low-pressure reaction chamber or vessel 620 maintained at a target pressure by one or more external vacuum pumps 630. The source 610 may be comprised of one or more lamps emitting a desired wavelength or range of wavelengths. The lamps may be arranged adjacent to or in proximity to the inlet showerhead 640 which provides injection of precursor from a feed line 650 for the precursor starting material. The source 610 is typically focused onto the growth surface of the moving metallic foil substrate 300. Such substrate is commonly provided in a reel to reel continuous feed system with the substrate passing through slits 660 in the walls of the reaction vessel 620.

Figure 6B:
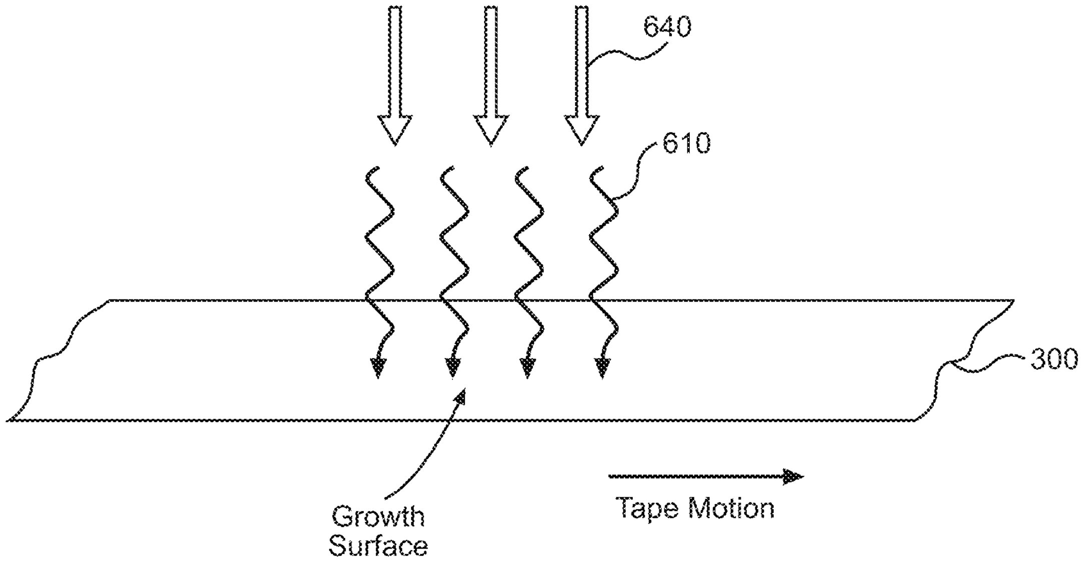
Figure 6C:
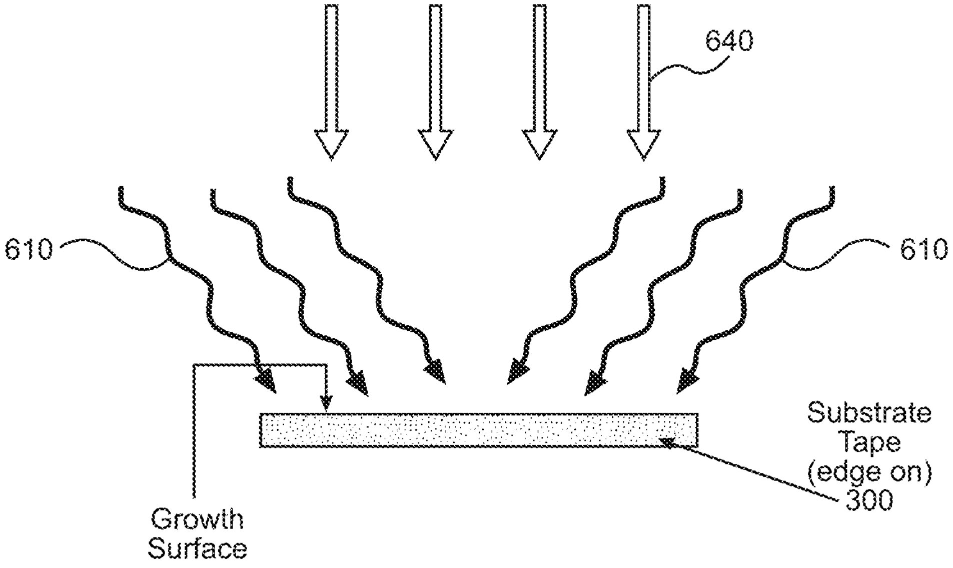

The REBCO deposition surface in certain preferred embodiments is continually irradiated by the UV/visible radiation flux from the radiation source 610 while the REBCO film is growing with the radiation striking the tape substrate onto which a REBCO film is being grown at a substantially normal incident angle as shown in FIG. 6B. Normal orientation of radiation yields the highest radiation density at the surface as any off-normal radiation configuration yields a lower radiation density. When a radiation source or sources 610 are arranged in a hemispherical pattern around the inlet showerhead 640, the exposure may have both perpendicular and non-zero angular radiation striking the surface as shown, for example, in FIG. 6C.

The UV/visible radiation at the surface of the growing film energetically excites the surface atoms to enhance their surface mobility thus allowing for more rapid attainment of their lowest energy configuration consequently yielding highly crystalline structure for the growing film. It is this highly crystalline structure in the a-b plane (i.e predominantly within the plane of the substrate) for REBCO that promotes high current capacity and high performance. Further, the localization of the energy which is promoting growth of the REBCO film at the growth surface by supplying the energy from above the growing film eliminates any thermal lag associated with supply of energy from below the tape substrate as in the use of typical heated substrate susceptors.

The UV/visible radiation present at the growth surface of the growing REBCO layer greatly enhances the growth rate of highly textured REBCO. Rates of 1.2 microns/min (μm/min) or higher are possible while maintaining high performance quality of the REBCO tape. The high growth rates are proposed to be due to physio-chemical effects including surface diffusion enhancement of the alighting elements forming the REBCO unit cell on the buffer layer surface. It is important to note that for REBCO films, high performance (high current carrying capacity) is mainly defined by the atomic order of the atoms in the growing REBCO film. Enhancing diffusion of the atoms by UV/Visible radiation as they alight onto the growth surface allows for more rapid movement of atoms to their lowest energy positions on the surface, i.e., enhancing growth of a highly crystalline surface which is required for high performance REBCO films.

As stated above, the direct radiation exposure of the growth surface results in REBCO (for example, YBCO) films that can be grown at rates of 1.2 μm/min or higher and as low as 0.01 μm/min, if desired. The REBCO films are grown with a high degree of texturing as defined by x-ray diffraction parameters of $\Delta\phi$ between 2° and 7°, and $\Delta\omega$ between 1° and 4° in certain preferred exemplary embodiments. The performance of the resulting exemplary YBCO wires or tapes as measured by their current carrying capacity may exceed 500 A/cm-width or higher at 77K. Such high growth rates allow for industrial production of high performance REBCO wire with commercially attractive economics.

In other preferred embodiments, the flow rates and stoichiometry of the starting precursor material is controlled in order to co-produce $RE_2O_3$ or $BaMO_3$ nanoparticles in the REBCO film for flux pinning. The growth rate is adjusted by control of precursor flow rates, and source energy inputs to ensure proper quantity, size and distribution of nanoparticles. Additionally, the stoichiometry of MOCVD precursor vapor contributes to the determination the composition of the secondary phase non-superconducting particles which act as the pinning centers. The non-superconducting particles of the present invention may in certain embodiments be generated by adding an excess of RE precursor or excess of Ba and introducing new M precursor into the vapor flow.

In one exemplary embodiment, $Y_2O_3$ non-superconducting particles are co-deposited in the YBCO as flux pining centers via PAMOCVD processing resulting in 20 atomic % excess Yttrium in the end coating. The deposition growth rate of HTS material in this example was approximately 0.2 μm/min upon a $CeO_2$ capped IBAD buffered substrate. In another embodiment YBCO is deposited with 40 atomic % excess Yttrium in the coating. The deposition growth rate of HTS material in this example was approximately 0.25 μm/min upon a $LaMnO_3$ capped IBAD buffered substrate.

As mentioned above, the density of pinning centers is an important factor in determining performance, and critical current may be limited by a low density of pinning centers. The presently disclosed methods permit tailoring performance by targeting specific densities of pinning centers via control of the above described process parameters. Presently disclosed non-superconducting particles deposited in the a-b plane without specific c-axis orientation at high growth rates permits significant gains in production rates and cost efficiencies.

As discussed above, the YBCO HTS material and with the non-superconducting flux pining centers can be produced by MOCVD from the precursor feed according to the following reactions:

$$Y_2O_3 + 4BaCO_3 + 6CuO \longrightarrow 2YBa_2Cu_3O_{6.5} + 4CO_2$$

$$Y_2O_3\,(XS) + 4BaCO_3 + 6CuO \longrightarrow 2YBa_2Cu_3O_{6.5} + 4CO_2 + Y_2O_3$$

Known systems for precursor delivery include gas, liquid, solid, and slurry-based approaches. In preferred embodiments using MOCVD, and in particular PAMOCVD based depositions, the precursors may be delivered as metal-organic compounds either as flash evaporated solids or as solvated vapor phase molecules using tetrahydrofuran (THF) or other suitable organic solvent.

The crystal structure of REBCO whereby the $CuO_2$ component in the unit cell may be comprised of 2-dimensional planes flanking the RE atom also further enhances the forming of non-superconducting nanoparticles (principally oxide particles) between the two $CuO_2$ planes as they can act as a capture mechanism for the particles in certain embodiments.

An important performance metric for this wire is to attain high critical current with the wire containing nanoparticles in the HTS layer for flux pinning which are distributed along a-b planes in the HTS layer with no specific vertical or near vertical alignment. Critical currents greater than 450 A/cm-width and 0.11 mm HTS tape thickness can be obtained at 4K and 19T when the magnetic field is perpendicular to the tape surface (H//c).

The Table below shows the Ic (A) measurement at 4K for magnetic fields perpendicular to the tape surface according to an embodiment of the present invention comprising the superconducting material having the composition $YBa_2Cu_3O_{7-x}$. The tape width is 4 mm and the corresponding Ic/cm-width at 19T is, 463.8 A/cm-width in this embodiment.

TABLE 1

| H(T) | Ic(A) |
|---|---|
| 2.0 | 498.4 |
| 4.0 | 404.9 |
| 6.0 | 353.8 |
| 8.0 | 312.2 |
| 10.0 | 280.7 |
| 12.0 | 252.9 |
| 13.0 | 239.6 |
| 14.0 | 229.0 |
| 15.0 | 218.3 |
| 16.0 | 209.3 |
| 17.0 | 200.7 |
| 18.0 | 192.1 |
| 19.0 | 185.5 |

The performance of the HTS wire in magnetic field is also often characterized by a measure commonly referred to as Lift Factor. The Lift Factor is typically defined as the ratio between the critical current at 77K, self-field and a separate temperature and field such as 4K and 20T. Unlike the critical current, which is an absolute value, the Lift Factor provides the relative relation of the two values. The wires of certain exemplary embodiments of the present disclosure have demonstrated lift at 4K, 20T (Ic (4K, 20T)/Ic (77K, self-field)), which corresponds to a Lift Factor of 2 or greater.

The ability to maintain high critical current performance at high growth rate is crucial towards commercial viability of HTS products. The thickness of the REBCO superconductor layer can have a growth rate of 0.2 μm/min, 1.0 μm/min, 1.2 μm/min, 1.5 μm/min and higher while retaining high flux pinning resulting in critical currents (Ic) above 450 A/cm-width at 4K and 20T and a corresponding engineering critical current density $J_E$ of 40,000 A/$cm^2$ or greater, where the engineering critical current density $J_E$ is defined as the critical current Ic divided by the total cross-sectional area of the HTS layer.

Figure 7:
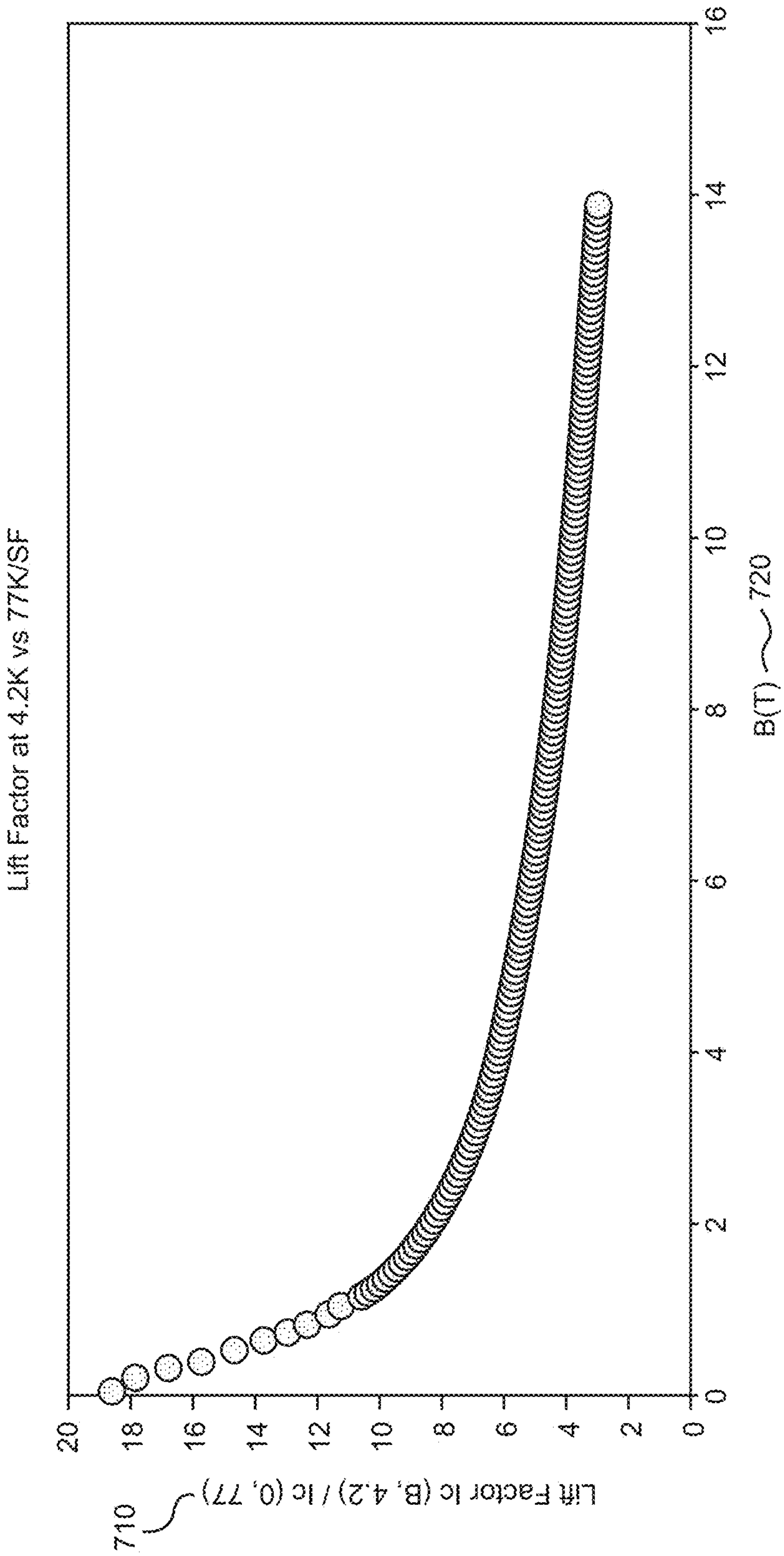
FIG. 7 shows the Lift Factor performance for example HTS wires produced by the presently disclosed methods.

FIG. 7 shows the Lift Factor performance for example HTS wires produced by the presently disclosed methods. The Lift Factor (Y-axis 710) Ic measured at 4.2K compared to Ic at 77K, self-field for a range of B field strengths measured in units Tesla (X-axis 720).

What is claimed is:

1. A thin film composite high-temperature superconducting article comprising:
a substrate;
a buffer layer; and
a high-temperature superconducting layer,
wherein the high-temperature superconducting layer further comprises non-superconducting material randomly distributed in the a-b plane coplanar with the superconducting layer.

2. The superconducting article of claim 1, wherein the non-superconducting material is comprised of $RE_2O_3$ where RE includes one or more of the following elements: Y, La, Nd, Sm, Eu, Gd, Tb, Dy, Ho, Er, Tm, Yb or Lu.

3. The superconducting article of claim 2, wherein the non-superconducting material is comprised of $Y_2O_3$, and the high-temperature superconducting layer comprises no foreign material.

4. The superconducting article of claim 3, further wherein the non-superconducting material is formed from an excess of yttria (Y).

5. The superconducting article of claim 4, further wherein the non-superconducting material is comprised of 20 atomic % excess Yttrium in the end coating.

6. The superconducting article of claim 1, wherein the non-superconducting material distributed randomly along the a-b plane coplanar with the superconducting layer lacks a substantial vertically oriented component in the c-axis.

7. The superconducting article of claim 1, wherein the non-superconducting material is comprised of $BaMO_3$ where M includes one or more of the following elements: Ti, Zr, Al, Hf, Ir, Sn, Nb, Mo, Ta, Ce, and V.

8. The superconducting article of claim 1, wherein the non-superconducting material is comprised of nano-particulates.

9. The superconducting article of claim 1, wherein the non-superconducting material is non-crystalline.

10. The superconducting article of claim 1, wherein the buffer layer and high-temperature superconducting layers are selected to ensure a lattice mismatch between the two layers.

11. A thin film composite high-temperature superconducting article comprising:
- a substrate;
- a buffer layer;
- a high-temperature superconducting layer, and
- wherein the high-temperature superconducting layer further comprises non-superconducting material randomly distributed in the a-b plane coplanar with the superconducting layer; and
- a lift factor at 4K, 20T (Ic (4K, 20T)/Ic (77K, self-field)) of 2 or greater.

12. The superconducting article of claim 11, wherein the non-superconducting material is comprised of $RE_2O_3$ where RE includes one or more of the following elements: Y, La, Nd, Sm, Eu, Gd, Tb, Dy, Ho, Er, Tm, Yb or Lu.

13. The superconducting article of claim 12, wherein the non-superconducting material is comprised of $Y_2O_3$, and the high-temperature superconducting layer comprises no foreign material.

14. The superconducting article of claim 13, further wherein the non-superconducting material is formed from an excess of yttria (Y).

15. The superconducting article of claim 14, further wherein the non-superconducting material is comprised of 20 atomic % excess Yttrium in the end coating.

16. The superconducting article of claim 11, wherein the non-superconducting material distributed randomly along the a-b plane coplanar with the superconducting layer lacks a substantial vertically oriented component.

17. The superconducting article of claim 11, wherein the lift factor is 3 or greater.

18. The superconducting article of claim 11, wherein the superconductor further comprises a critical current (Ic) of 450 A/cm-width or higher at 4K and 20T.

19. The superconducting article of claim 11, wherein the non-superconducting material is comprised of nano-particulates.

20. The superconducting article of claim 11, wherein the buffer layer and high-temperature superconducting layers are selected to ensure a lattice mismatch between the two layers.

* * * * *